INTEGRATED COMPLEMENTARY MOS-TYPE TRANSISTOR STRUCTURE
AND METHOD OF MAKING SAME

Filed May 31, 1967

WITNESSES
Edwin E. Barder
James F. Young

INVENTORS
Robert C. Gallagher &
Irving F. Barditch
BY
Gordon H. Telfer
ATTORNEY

United States Patent Office 3,440,503
Patented Apr. 22, 1969

3,440,503
INTEGRATED COMPLEMENTARY MOS-TYPE TRANSISTOR STRUCTURE AND METHOD OF MAKING SAME

Robert C. Gallagher and Irving F. Barditch, Baltimore, Md., assignors to Westinghouse Electric Corporation, Pittsburgh, Pa., a corporation of Pennsylvania Filed May 31, 1967, Ser. No. 642,471
Int. Cl. H01l 19/00
U.S. Cl. 317—235 10 Claims

ABSTRACT OF THE DISCLOSURE

A complementary MOS transistor structure including one element in a principal region having a positive impurity concentration gradient from the surface produced by out diffusion through an epitaxial layer. The epitaxial layer is of the same conductivity type as the underlying bulk material. The principal region may also serve as a source or drain region of the other transistor element. Source and drain regions are formed in the principal region by diffusion after the out diffusion step.

BACKGROUND OF THE INVENTION

*Field of the invention*

This application is directed to semiconductor devices, particularly complementary MOS-type transistors, and methods of making the same.

An MOS-type transistor generally comprises a first semiconductive region in which source and drain regions of opposite type to the first region are disposed. A channel region is defined between the source and drain regions. The channel conductivity is variable in accordance with potentials applied to a gate electrode capacitively coupled thereto through an insulating layer disposed on the channel surface. MOS-type transistors are of increasing interest, particularly because of their high input impedance compared with bipolar transistors and also because a large number of such elements may be disposed in a single body of material economrically where the intended circuit application requires MOS transistors of only a single polarity.

There are known MOS transistor circuits, however, paritcularly for fast switching at low power levels, that require MOS transistors of opposite polarities.

*Description of the prior art*

Circuits that require complementary MOS transistors, that is at least one of each polarity, have primarily been formed by using discrete MOS transistors because of difficulty in integrating satisfactory MOS transistors in complementary pairs.

Prior known complementary MOS transistor structures and methods for their fabrication include that produced by forming the opposite polarity element by direct diffusion. In all of the various methods discussed herein a first polarity element may be formed by merely conventional techniques of diffusing source and drain regions into a region of opposite type wherein the channel is defined. The opposite type element is formed, according to the direct diffusion technique, by diffusing into the structure from the surface of the semiconductive body a dopant material of opposite type to that of the body to produce a region wherein the source and drain regions of the second element are subsequently formed by diffusion. The high surface concentration and relative difficulty of precise control of surface concentration of the channel region produced by this direct diffiusion technique makes it unattractive for widespread use.

Purposes of this invention therefore are to provide improved complementary MOS transistor structures that may be readily fabricated by process operations compatible with those now employed in integrated circuit technology and that are relatively reproducible without requiring undue precision and control in the fabrication processes.

SUMMARY OF THE INVENTION

This invention achieves the intended results and other advantages through the utilization of a region having a positive impurity concentration gradient over its entire area from the surface of the structure for the formation of the MOS transistor of opposite polarity to the conventional element. By positive impurity concentration gradient is meant that the impurity concentration increases with increasing distance from the surface. In accordance with the method of this invention, the region having a positive impurity concentration gradient is formed by out diffusion through an epitaxially grown layer.

The formation of source and drain regions into the out diffused region may be by straight forward selective diffusion operations. It is possible that the MOS element having the original body of material for its channel region has source and drain regions similarly produced by out diffusion through the epitaxial lawer in order to avoid an additional direct diffusion operation. In some embodiments, the principal region in which the element of opposite polarity is disposed may provide a source or drain region of the other MOS element. Structures in accordance with this invention may be used in any of the varieties of known circuit applications for complementary MOS transistor elements.

The term MOS is an acronym for metal-oxide-semiconductor. Throughout this application, however, it is to be understood that the reference to "MOS transistors" or the like, is intended to encompass the described type of device whether the insulating material therein is in fact an oxide layer or some other insulating material such as a nitride or a mixture or nonhomogeneous arrangement of insulating mtaerials. Another term that might be used to describe the type of devices with which this application is concerned is IGFET, an acronym for insulated-gate-field-effect-transistor.

DESCRIPTION OF THE PREFERRED EMBODIMENTS

Figure 1:
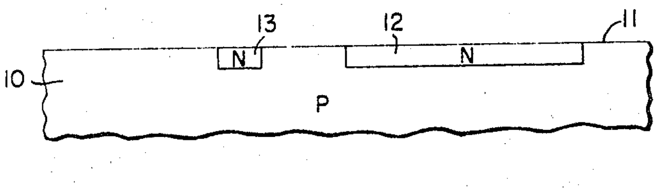
FIGS. 1 to 4 are sectional views of one embodiment of a complementary MOS transistor structure in accordance with this invention at successive stages in the fabrication process.

In FIG. 1, there is illustrated a p-type substrate 10 that may be, for example, monocrystalline silicon of commercial device quality material doped to provide a resistivity in the range of about 5 ohm centimeters to about 10 ohm centimeters. On a major surface 11 of the substrate 10 is deposited n-type impurity material in selected portions 12 and 13, the purposes of which will be subsequently described. It is convenient that these deposits 12 and 13 be of mtaerial containing phosphorus diffused in a shallow layer to provide a surface concentration of about $10^{20}$ atoms per cubic centimeter. The depth to which impurities extend during this deposition may be about 3 microns or less.

Figure 2:
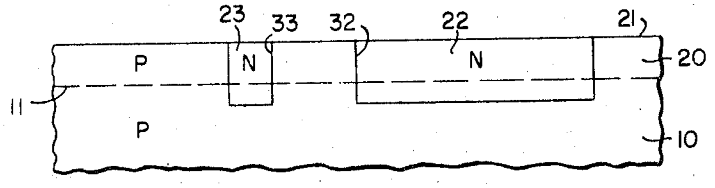

In FIG. 2 the structure is shown after there has been formed by epitaxial growth over the surface 11 of the substrate 10 a layer 20 of p-type semiconductivity material having a thickness of, for example, about 12 to 14 microns of a resistivity, for example, of about 3 to 5 ohm centimeters. Due to the heating to which the structure is subjected during the epitaxial growth operation the impurities previously deposited in the substrate out diffuse through the epitaxial layer as it grows so that n-type regions 22 and 23 and junctions 32 and 33 extend to the surface 21 of the epitaxial layer 20.

The structure of FIG. 2 is complete as to the provision of the semiconductive regions for a first MOS type transistor of one polarity wherein the n-type regions 22 and 23 provide source and drain regions for an n-channel device, the channel being defined at the surface 21 between the source and drain regions. Provision of an insulating layer over the channel region and a conductive electrode disposed thereon with contacts to each of the source and drain regions would complete the structure.

Figure 3:
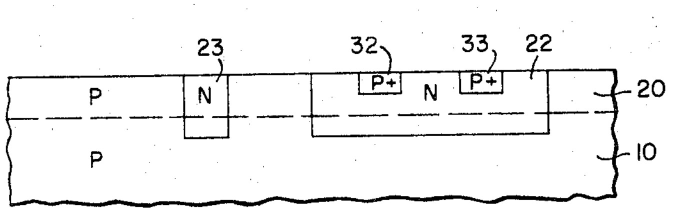

However, in order to complete a complementary structure there is formed, after the structure in FIG. 2 is completed and as illustrated in FIG 3, source and drain regions 32 and 33 of p-type conductivity in the principal n-type region 22. These source and drain regions 32 and 33 may be formed by selective diffusion to a surface concentration of about $10^{19}$ to $10^{20}$ atoms per cubic centimeter and a depth of about five microns. It is now seen that a second MOS transistor element of opposite polarity is provided within the principal region 22.

Figure 4:
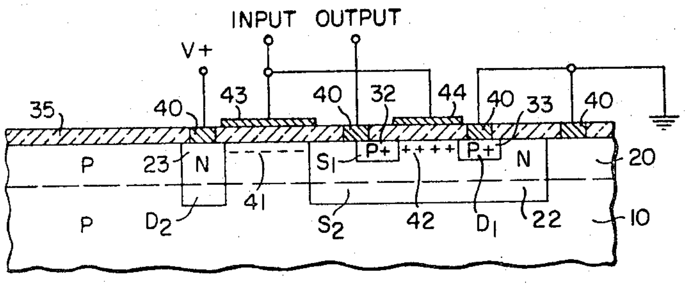

FIG. 4 shows a structure after an insulating layer 35 (e.g. silicon dioxide) has been disposed over the surface, at least covering the channel regions 41 and 42 between the respective source and drain regions. Gate electrodes 43 and 44 are positioned on the insulating layer 35 over the channel regions 41 and 42, respectively. Contacts 40 are also disposed on each of the source and drain regions.

In the particular embodiment illustrated in FIG. 4 one of the contacts 40 to the source 32 of the second MOS element is shorted to the adjacent portion of the n-type region 22 that also serves as the source of the first MOS element so that these regions are connected by their source regions. Where a common source relationship between two elements is not desired, separate regions and contacts may be provided. The circuit configuration shown in FIG. 4 is merely exemplary and structures in accordance with this invention may be used in various MOS complementary transistor circuits.

By reason of the formation of the principal region 22 of the p-channel device by out diffusion, the surface concentration is reduced to the order of $10^{17}$ atoms per cubic centimeter compared with about $10^{19}$–$10^{20}$ atoms per cubic centimeter by direct diffusion. The lower concentration is more suitable for MOS operation because it more readily permits the formation and control of an inversion layer. Additionally the structure and method of fabrication of FIGS. 1–4 is advantageous in minimizing the total number of process operations because the source and drain regions for the first formed element are produced in the same operations as the principal region 22 for the second formed element. Of course source and drain regions for each of the elements may be entirely separated at least by a distance greater than the channel regions of the individual elements so that there is no direct interaction therebetween.

The formation of the epitaxial layer 20 and the out diffusion of impurities to for the principal region for the complementary element may be performed in accordance with known epitaxial growth technology such as by the thermal decomposition of silicon tetrachloride with hydrogen, with the presence of a doping impurity source such as diborane, for a p-type layer, carried out for a time of about 60 minutes at about 1200° C., as an example.

Figure 5:
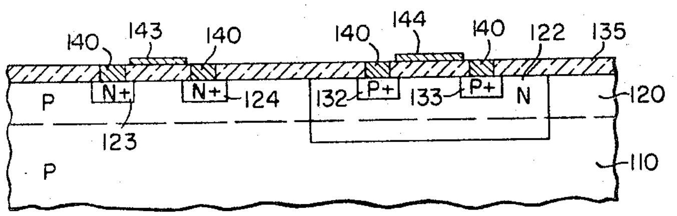
FIG. 5 is a sectional view of an alternative embodiment of the present invention.

FIG. 5 illustrates a structure in accordance with this invention utilizing an out diffused n-type region 122 for the formation of one of the complementary MOS elements wherein the source and drain regions 123 and 124 of the other element are separated therefrom and are formed by a straightforward diffusion operation after the formation of the out diffused region 122. This diffusion may be conveniently performed to a surface concentration of about $10^{20}$ to $10^{21}$ atoms per cubic centimeter and a depth of about 2 to 3 microns. The elements of FIG. 5 are generally designated by reference numerals having the same last two digits as those designating corresponding elements of FIG. 4.

All of the operations required to make structures in accordance with this invention are compatible with existing fabrication technology. The invention may be practiced using semiconductor materials, dopants, conductivity type, resistivity and other features varied from those specifically mentioned.

While the present invention has been shown and described in a few forms only, it will be apparent that various other modifications may be made without departing from its scope.

We claim:

1. A complementary MOS-type transistor structure comprising: a first MOS-type transistor of a first polarity including a bulk material of a first conductivity type with first and second regions of a second conductivity type in a surface thereof and each forming a PN junction therewith to provide first source and drain regions spaced a first distance to define a first channel region at the surface of said bulk material; a second MOS-type transistor of a second polarity including a principal region of said second conductivity type in said surface of said bulk material and forming a PN junction therewith underlying and surrounding said principal region, said principal region having a positive impurity concentration gradient from said surface over its entire area; third and fourth regions of said first conductivity type in said principal region and each forming a PN junction therewith to provide second source and drain regions spaced a second distance to define a second channel region at the surface of said principal region.

2. The subject matter of claim 1 wherein: said principal region and one of said first source and drain regions are provided by a single region of semiconductive material.

3. The subject matter of claim 1 wherein: said principal region is separate from each of said first source and drain regions and is spaced therefrom by a distance greater than said first distance.

4. The subject matter of claim 1 wherein: said first source and drain regions also have a positive impurity concentration gradient.

5. The subject matter of claim 1 further comprising: a layer of insulating material covering at least said channel regions, and contacts on each of said source and drain regions and on said layer of insulating material over each of said channel regions.

6. In a method of forming a complementary MOS-type transistor structure the steps including: forming a layer of insulating material on a major surface of a body of semiconductive material; selectively removing a limited portion of said insulating layer; depositing a quantity of dopant material that produces a first type of conductivity within the exposed portion of said major surface; removing said insulating layer; depositing epitaxially a layer of semi-conductive material of a second type of conductivity over said major surface; redistributing said quantity of dopant material to form a region of said first type extending through said epitaxially deposited layer and having a positive impurity concentration gradient from said surface; selectively diffusing, after said redistributing of said quantity of dopant material, source and drain regions of said second conductivity type in said region of said first type.

7. The subject matter of claim 6 wherein: said body of semiconductive material is of said second type of conductivity; and source and drain regions of said first conductivity type are selectively diffused in the surface of said epitaxially deposited layer in positions spaced from said region of said first type having said positive impurity concentration gradient.

8. A complementary MOS-type transistor structure comprising: a first MOS-type transistor of a first polarity including a bulk material of a first conductivity type with first and second regions of a second conductivity type in a surface thereof and each forming a PN junction therewith to provide first source and drain regions spaced a first distance to define a first channel region at the surface of said bulk material; a second MOS-type transistor of a second polarity including as a principal region one of said first and second regions of second conductivity type in said surface of said bulk material, said principal region having a positive impurity concentration gradient from said surface over its entire area; third and fourth regions of said first conductivity type in said principal region and each forming a PN junction therewith to provide second source and drain regions spaced a second distance to define a second channel region at the surface of said principal region.

9. The subject matter of claim 8 wherein: the one of said first and second regions, other than said principal region, also has a positive impurity concentration gradient.

10. The subject matter of claim 8 further comprising: a layer of insulating material covering at least said channel regions, and contacts on each of said source and drain regions and on said layer of insulating material over each of said channel regions.

References Cited

UNITED STATES PATENTS

| | | | |
|---|---|---|---|
| 3,340,598 | 9/1967 | Hatcher | 29—571 |
| 3,356,858 | 12/1967 | Wanlass | 307—88.5 |

JOHN W. HUCKERT, *Primary Examiner.*

R. SANDLER, *Assistant Examiner.*

U.S. Cl. X.R.

148—175